United States Patent [19]

Bluhm

[11] 4,115,872
[45] Sep. 19, 1978

[54] AMORPHOUS SEMICONDUCTOR MEMORY DEVICE FOR EMPLOYMENT IN AN ELECTRICALLY ALTERABLE READ-ONLY MEMORY

[75] Inventor: Vernon A. Bluhm, San Diego, Calif.

[73] Assignee: Burroughs Corporation, Detroit, Mich.

[21] Appl. No.: 801,773

[22] Filed: May 31, 1977

[51] Int. Cl.$^2$ ............................................. G11C 11/00
[52] U.S. Cl. ....................................... 365/163; 357/2
[58] Field of Search ...................... 340/173 R; 357/2; 365/163

[56] References Cited

U.S. PATENT DOCUMENTS

| | | | |
|---|---|---|---|
| 3,886,577 | 5/1975 | Buckley | 357/2 |
| 3,980,505 | 9/1976 | Buckley | 357/2 |

Primary Examiner—Bernard Konick
Assistant Examiner—Donald McElheny
Attorney, Agent, or Firm—Mervyn L. Young; Kevin R. Peterson

[57] ABSTRACT

This disclosure relates to an electrically alterable amorphous memory device which can be switched from a high resistance state to a low resistance crystalline state. The device has increases in the concentration of those particular elements at the electrodes to which the respective constituents would migrate during a large number of set-reset cycles. This lessens the decline in the threshold voltage caused by the electromigration of those constituents. There is disclosed a layered structure in which a layer rich in one appropriate constituent is placed between the amorphous memory material layer and the respective electrode and another layer of material rich in the other constituent is placed between the amorphous material and the other electrode. Specifically, there is disclosed a tellurium based chalcogenide as the memory layer. A layer of substantially tellurium is placed between the amorphous memory layer and the positive electrode while the layer of germanium and tellurium in a ratio of approximately 1:1 is placed between the amorphous material and the negative electrode.

10 Claims, 5 Drawing Figures

AMORPHOUS SEMICONDUCTOR MEMORY DEVICE FOR EMPLOYMENT IN AN ELECTRICALLY ALTERABLE READ-ONLY MEMORY

BACKGROUND OF THE INVENTION

1. Field of Invention

This invention relates to an electrically alterable read-only memory and more particularly to an amorphous semiconductor memory device cell for employment therein.

2. Description of the Prior Art

Most semiconductor memory cells are volatile in the sense that they must be refreshed in order to maintain the data stored therein. In the case of semiconductor memory latches, the cell is still volatile in the sense that data is lost should there be a power failure. However, it has been discovered that certain amorphous semiconductor materials are capable of being switched to and from a low resistance crystalline state which does provide a non-volatile memory cell. Particular materials that may be employed are disclosed in the Ovshinsky U.S. Pat. No. 3,271,591, the Neale U.S. Pat. No. 3,699,543 and the Buckley U.S. Pat. No. 3,886,577. A particular type of memory switching amorphous semiconductor material is the tellurium based chalcogenide class materials which have the general formula;

$$Ge_A Te_B X_C Y_D$$

Such amorphous high resistance semiconductor material can be placed between a pair of spaced apart electrodes such that the application to one of those electrodes of a voltage pulse above a given threshold produces a relatively low resistance filamentous crystalline path (set operation). A reset set of pulses of appropriate value and duration causes the crystalline path to return to the relatively amorphous state (reset operation).

The prior art designs of amorphous or ovonic memory switches have had a characteristic threshold voltage $V_T$ which is high at the first operation and in early operating life and lower thereafter ("first-fire effect") or which declines continuously throughout the life of the switch. Particularly, this decline is in response to repeated "reset" operations where the memory element is restored from its conducting condition to its high resistance condition. However, there are instances where it appears that the device lasted through $10^6$ set-reset cycles where the threshold voltage was observed to have a minimum low value (between 5 and 10 volts) and was relatively invariant to additional write cycles.

It now appears that electromigration of the constituents of the memory material toward the different electrodes causes the steady decline in the threshold voltage. In the above described materials, germanium is shown to migrate to the negative electrode and to approach 50% concentration there. Similarly, tellurium migrates to the positive electrode. This migration of material produces regions that are inactive in the switching process because their ratios of constituents are no longer appropriate. The region where the ratio of constituents is appropriate for switching is thus reduced in effective thickness and the threshold voltage becomes low, similar to that of a much thinner layer.

The migration of material also produces concentration gradients. Diffusion then operates as a countervailing process, producing an equilibrium. Thermal gradients may also contribute to the process.

The above referenced Buckley patent discloses an ovonic memory structure in which the threshold voltage decline is altered by placement of a tellurium layer between the positive electrode and the amorphous memory material layer. This alters the threshold voltage decline but doesn't eliminate it.

It is then an object of the present invention to provide an improved amorphous semiconductor memory device.

It is another object of the present invention to provide an improved amorphous semiconductor memory device which is not characterized by a declining threshold voltage.

It is still another object of the present invention to provide an amorphous semiconductor memory device which has a relatively constant threshold value over a large number of set-reset cycles.

SUMMARY OF THE INVENTION

Since the decline in the threshold voltage is caused by electromigration of the constituents of the amorphous memory material, this decline can be lessened by increasing the concentration of those particular elements at the electrodes to which the respective constituents migrate. Thus, the present invention is directed toward a layered structure in which a layer rich in one appropriate constituent is placed between the amorphous memory material layer and the respective electrode and another layer of material rich in the other constituent is placed between the amorphous material and the other electrode. Specifically, the present invention employs the tellurium base chalcogenide $Ge_{15}Te_{81}Sb_2S_2$. With is embodiment, a layer of substantially tellurium is placed between the amorphous material and the positive electrode while a layer of germanium and tellurium in a ratio of approximately 1:1 is placed between the amorphous material and the negative electrode. Another embodiment may employ $Ge_{24}Te_{72}Sb_2S_2$ as the amorphous memory material.

A feature then in the present invention resides in an amorphous memory switch having a region of amorphous semiconductor material placed between spaced-apart electrodes with a region rich in one of the constituents being placed between that material and one electrode and a region rich in the other constituent placed between the amorphous region and the other electrode. An additional feature of the present invention resides in such amorphous memory structure employing improved barriers between the amorphous memory material described above and both of the electrodes.

DESCRIPTION OF THE DRAWINGS

The above and other objects, advantages and features of the present invention will become more readily apparent from a review of the following specification when taken in conjunction with the drawings wherein.

GENERAL DESCRIPTION OF THE INVENTION

As was indicated above, the present invention employs an amorphous semiconductor material which is of the tellurium based chalcogenide class materials: $Ge_A Te_B X_C Y_D$. The X constituent may be antimony, bismuth, arsenic or others, while the Y constituent may be sulfur or selenium. A preferred embodiment of the present invention employs the material $Ge_{15}Te_{81}Sb_2S_2$. $Ge_{24}Te_{72}Sb_2S_2$ may be employed in another embodiment.

Figure 1:
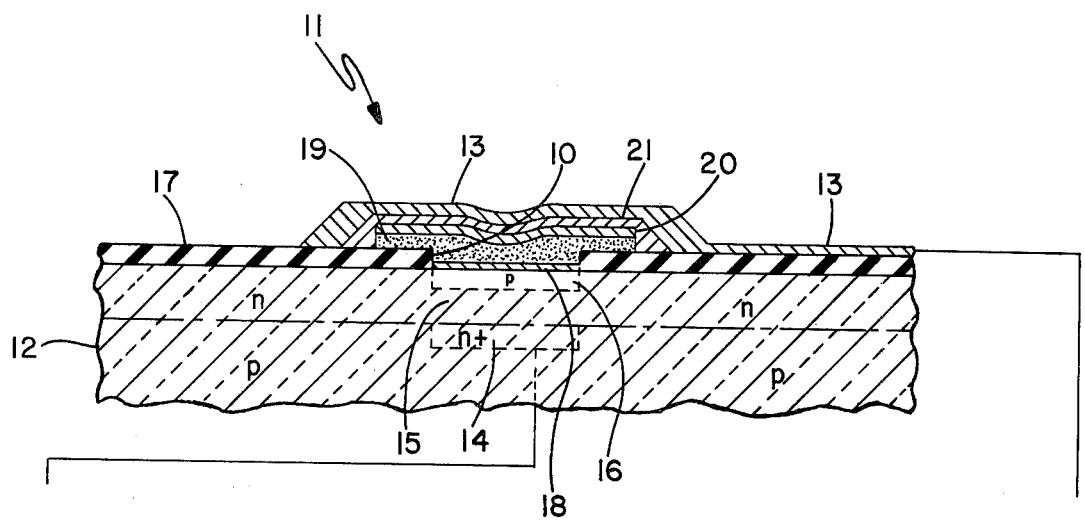
FIG. 1 is a cross-section of an amorphous memory device of the prior art.

An embodiment or prior art memory device which uses such a material is illustrated in FIG. 1. As shown there, the entire memory device 11 is formed as an integral part of a silicon substrate 12. Device 11 would normally be employed in an array having vertical and horizontal conductors for the random access thereof. In FIG. 1, one of these conductors is the N+ region 14 in substrate 12 which forms a part of a rectifier made up by region 14, N region 15 and P region 16. This rectifier along with memory device 11 form the crossover point between the orthogonal conductors 13 and 14 where conductor 14 is the positive electrode.

Silicon chip 12 is provided with an insulating material 17 which maybe silicon dioxide and in turn is provided with a plurality of openings 10 to initially expose the semiconductor material at those points where respective memory devices 11 are to be located. An electrically conductive layer 18 is selectively deposited over the exposed portions of the silicon chip. The amorphous semiconductor memory material 19 is then deposited by appropriate techniques over opening 15. To complete the memory device, crystalline tellurium layer 20 is sputter deposited over the memory material and a barrier-forming refractory metal layer 21 is deposited over that before the electrically conductive metal layer 13 is formed. As disclosed in the above referenced Buckley Patent, the material of layer 20 is purposely chosen to be tellurium so as to offset the tellurium migration towards the positive electrode during the set and reset cycles. The material of layer 21 is chosen to be a barrier to the migration of the material of layer 13 (e.g.: Al). As was indicated above, while this tends to alter the threshold voltage decline, it does not eliminate it. The present invention is designed to provide a much more stable threshold voltage over a much longer lifecycle.

Figure 2:
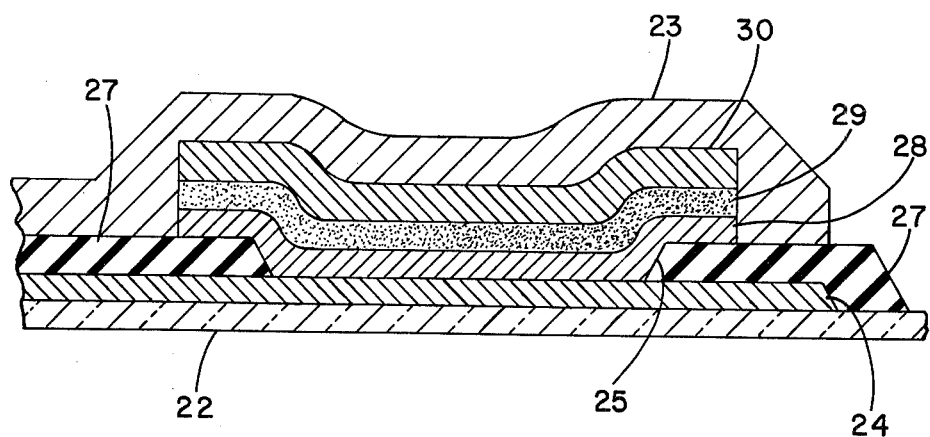
FIGS. 2–4 are cross-sectional diagrams of various embodiments of the present invention.

A general embodiment of the present invention is illustrated in FIG. 2. As shown therein, the memory device is formed on an insulative layer 22 which may or may not be a semiconductor substrate as in the case of FIG. 1. To complete the appropriate connections, conductor 24 is first formed on insulator layer 22. Another insulative layer 27 is formed thereover with an opening 25 to receive the memory device. At this point, the present invention departs markedly from the prior art in that layer 28 is deposited which layer is a tellurium base chalcogenide, specifically germanium-tellurium with a proportion with the respective constituents of 1:1. On top of this layer, the amorphous memory glass material 29 is formed and a tellurium based layer 30 is deposited over the memory glass layer. Tellurium based layer 30 may contain up to 10% germanium. The second conductor 23 is then formed over the device. In the embodiment of FIG. 2, the amorphous memory glass layer 29 is composed primarily of germanium and tellurium with the amount of germanium ranging between 15% and 33%.

In one embodiment of the present invention layer 29 of FIG. 2 may be found to be unnecessary since, after the device has been baked and operated electrically, the compositions of the layer will blend into a smoothly graded structure approximating the structure of a traditional device after operation through many thousands of cycles. In this case the initial threshold voltage will be zero or very low, and will rise to its equilibrium value only upon the electrical switching exercise.

Figure 3:
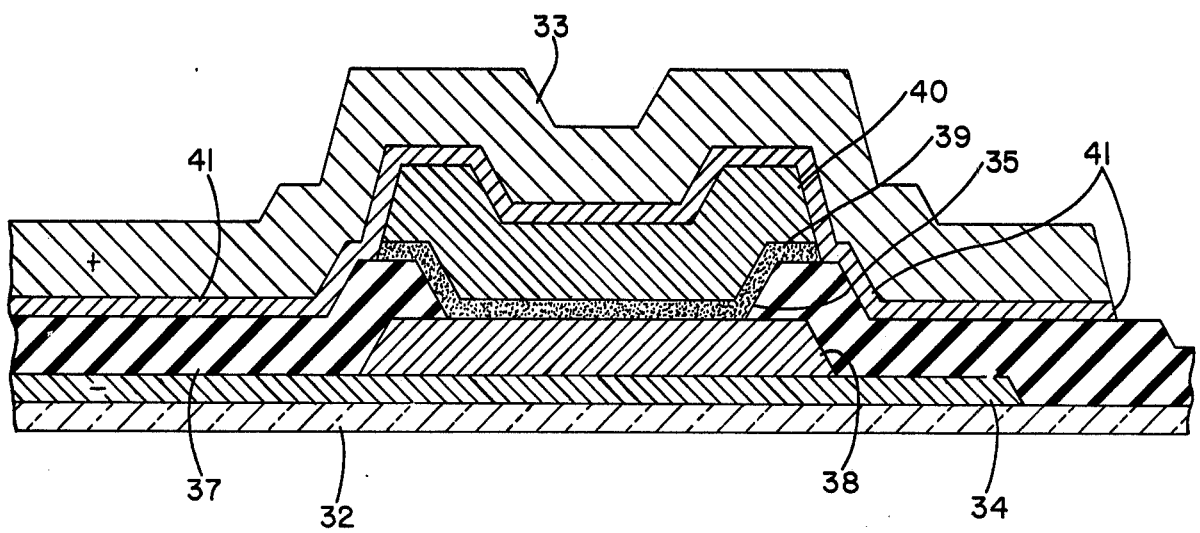

A specific embodiment of the present invention is illustrated in FIG. 3. This device is similar in structure to the embodiment of FIG. 2 except that a barrier conductor layer is formed over the entire memory device and insulative substrate. In FIG. 3, the device is again formed on suitable insulative substrate 32 which may be of a semiconductor material. Negative conductor 34 is then formed thereon and layer 38 is a composition of germanium tellurium in a ratio of approximately 1:1 and is selectively deposited. Insulative layer 37 is then formed over the selectively deposited germanium tellurium layer 38 with openings 35 in insulator 37 at the locations of the germanium tellurium selective deposits. The amorphous memory material 39 and the tellurium material 40 are then deposited selectively so as to overlap opening 35. Of course, the respective layers 37, 39 and 40 may be deposited over-all and selectively removed. Barrier conductor material 41 is then deposited over the entire memory device and positive conductor 33 is then formed.

Insulative layer 37 of FIG. 3 is a dielectric which may be chemically vapor deposited and may be patterned photolithographically in a manner to form respective openings 35 as "pores". With this method, layer 37 permits layer 38 to be very conductive, either because of the method of deposition or because of the thermal treatment after deposition; without becoming a short circuit between layers 34 and 41.

The amorphous material 39 may be of the approximate composition ranging from $Ge_{15}Te_{85}$ to $Ge_{33}Te_{66}$ possibly with additives. It also may be patterened photolithographically. This layer may also be omitted, but if omitted, it may be formed effectively on the "pore" area by electrical and thermal action on the completed device.

Layer 40 may be tellurium possibly with additives so as to be in conducting state at the time of the first electrical test. It may be patterned simultaneously with the amorphous material 39. The barrier conductor material 41 may be molydenum or $Ti_{10}W_{90}$. High conductance conductor 33 may be aluminum or gold.

Figure 4:
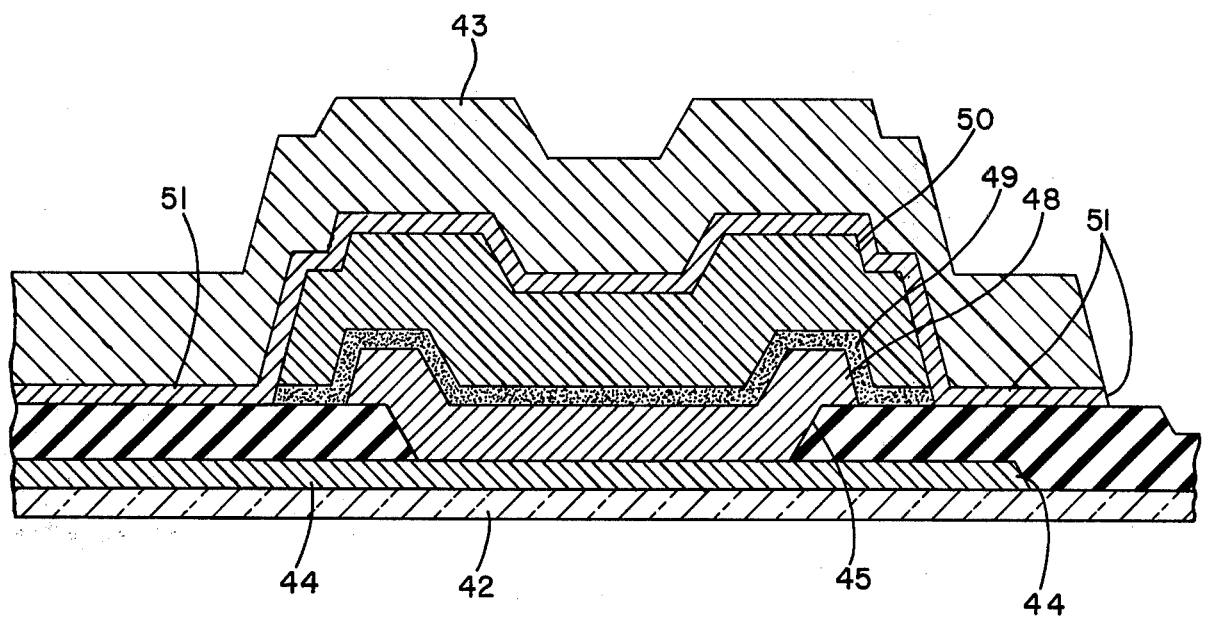

Another embodiment of the present invention is illustrated in FIG. 4. This embodiment is similar to FIG. 3 and will not be described in detail except to point out the germanium rich material 48 overlaps opening 45 in the dielectric material 44 and amorphous memory material 49. Also, the tellurium rich layer 50 overlaps the selective deposited area of the germanium rich material 48.

While the embodiments of this invention, as described in detail above, utilize three layers of material, each uniform in concentration within the layer as deposited, the use of layers of graded composition may also be useful. Indeed, a structure consisting of one continuously graded layer may be optimum. The use of multiple layers to approximate initially the continuously graded structure that results from operation of the device through many set-reset cycles is a convenience in fabrication of the device. Use of multiple layers, more-over, permits the separate heat treatment of the first layer or layers to establish it in a more or less conducting condition before operation.

More than three layers may also be used to more closely still approximate the continuously graded structure that results from operation through many set-reset cycles.

Figure 5:
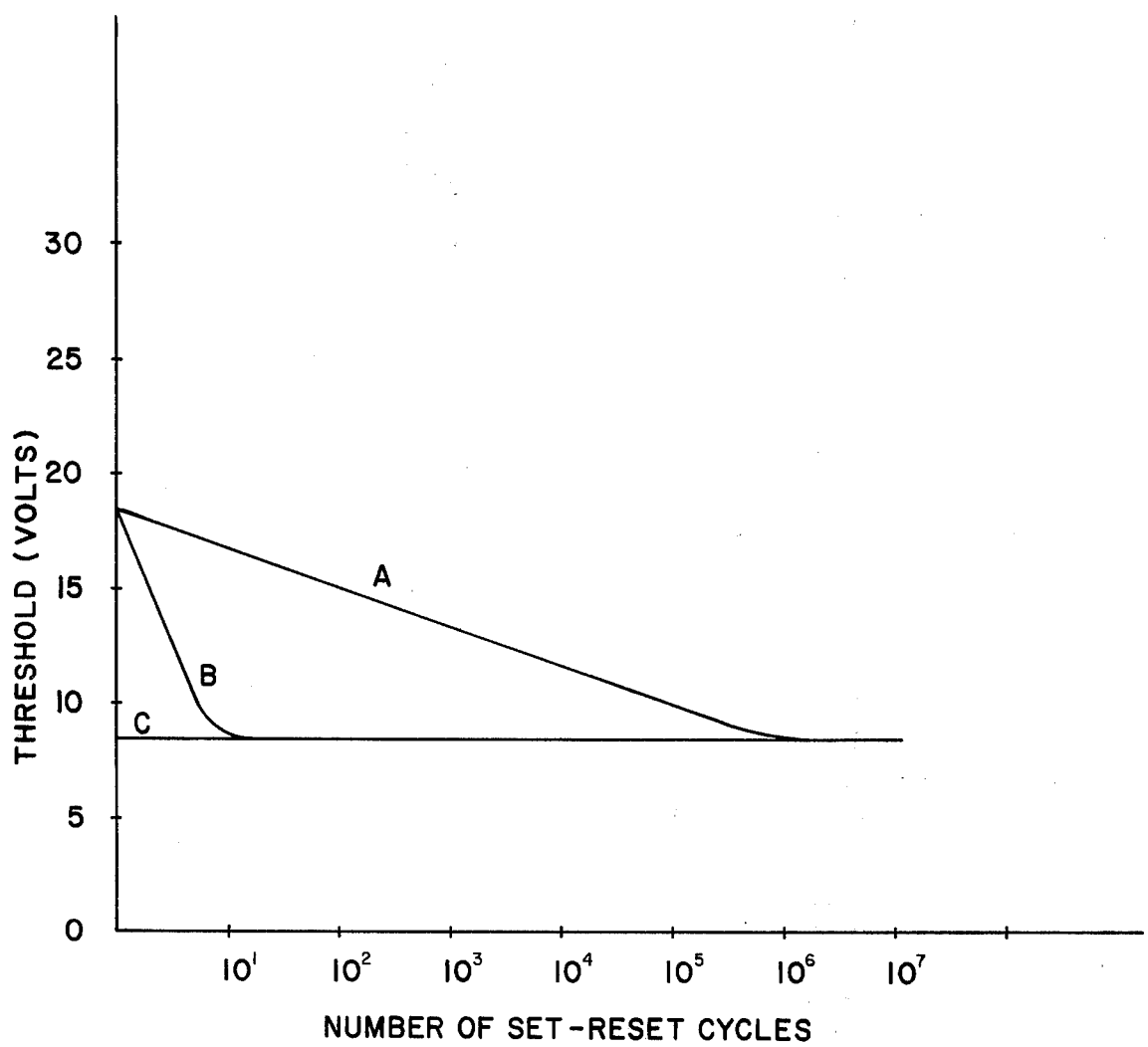
FIG. 5 is a curve of the threshold voltage variations of different devices as a function of the number of set-reset cycles.

Comparison of threshold values of the present invention with the declining threshold values of prior art devices is disclosed in FIG. 5 which is a set of curves representing threshold voltage values as a function of the number of set-reset cycles. Curve A represents the threshold value decline for a uniform amorphous material layer of the prior art. It will be observed that this threshold value continues to decline until at least $10^6$ set-reset cycles after which it appears to be invarient to additional cycles. Curve B represents the threshold voltage variation for prior art device such as the type disclosed in FIG. 1. Here again, the threshold value is initially high and levels out after about $10^2$ cycles after which it is relatively invarient.

As distinct therefrom, Curve C represents the threshold value stability of the present invention where the difference in percentage of constituents in the various regions of the present invention approach that of what is observed in a standard amorphous memory device after $10^6$ set-reset cycles. It is observed that the threshold value although equal to the minimum low value observed by the other prior art devices starts out at this low value and is constant throughout the life of the device. The magnitude of this minimum low threshold value can be adjusted by adjusting the thickness of the amorphous memory layer. As has been indicated above, the thickness of the amorphous material region in the prior art devices tend to be reduced by the constituent migrations to the respective electrodes.

EPILOGUE

Different embodiments of the present invention have been described above, which embodiments are a layered or graded structures each region of which has a different concentration of particular constituents of the amorphous memory material so as to approach that structure which is achieved by a uniform amorphous material after many set-reset cycles. The layers of regions closest to the positive electrode should be increasingly rich in tellurium while the layers closest to the negative electrode should be increasingly rich in germanium. By appropriate adjustment of the number of layers and their concentration of constituents, one can obtain an amorphous memory device which has an uniform threshold value throughout its life cycle. Such a device is most desirable for use in an electrically alterable read-only memory.

While three embodiments of the present invention have been disclosed, it will be understood by one skilled in the art that variations and modifications may be made therein without departing from the spirit and the scope of the invention as claimed.

What is claimed is:

1. An electrically alterable memory device comprising:
 a positive electrode;
 a negative electrode; and
 a structure of memory material mounted inbetween said electrodes, which structure is constructed of first, second and third regions, said first region being adjacent to said positive electrode, said third region being adjacent to said negative electrode, said second region being between said first and third regions;
 said second region being formed of a tellurium based chalcogenide which has higher electrical resistance in its amorphous state and lower electrical resistance in its crystalline state and can be switched from one state to the other upon application of said electrodes of an electrical signal of appropriate value;
 said first region being formed of a material having a higher percentage of tellurium than said second region;
 said third region being formed of material having a higher percentage of germanium than said second region.

2. A memory device according to claim 1 wherein said first region is substantially tellurium.

3. A memory device according to claim 1 wherein said third region is formed of approximately equal proportions of tellurium and germanium.

4. A memory device according to claim 1 wherein said second region is formed of $Ge_{15}Te_{81}Sb_2S_2$.

5. A memory device according to claim 1 wherein said second region is formed of $Ge_{24}Te_{72}Sb_2S_2$.

6. An electrically alterable memory device comprising:
 a positive electrode;
 a negative electrode; and
 a structure of memory material mounted inbetween said electrodes, which structure is constructed of first, second and third layers, said first layer being adjacent to said positive electrode, said third layer being adjacent to said negative electrode, said second layer being between said first and third layers;
 said second layer being formed of a tellurium based chalcogenide which has higher electrical resistance in its amorphous state and lower electrical resistance in its crystalline state and can be switched from one state to the other upon application of said electrodes of an electrical signal of appropriate value,
 said first layer being formed of a material having a higher percentage of tellurium than said second layer;
 said third layer being formed of material having a higher percentage of germanium than said second layer.

7. A memory device according to claim 6 wherein said first layer is substantially tellurium.

8. A memory device according to claim 6 wherein said third layer is formed to approximately equal proportions of tellurium and germanium.

9. A memory device according to claim 6 wherein said second layer is formed of $Ge_{15}Te_{81}Sb_2S_2$.

10. A memory device according to claim 6 wherein said second layer is formed of $Ge_{24}Te_{72}Sb_2S_2$.

* * * * *